(12) United States Patent
Ikari et al.

(10) Patent No.: US 11,380,525 B2
(45) Date of Patent: *Jul. 5, 2022

(54) RING FOR ELECTRODE (71) Applicant: THINKON NEW TECHNOLOGY JAPAN CORPORATION, Tokyo (JP)

(72) Inventors: Atsushi Ikari, Shunan (JP); Satoshi Fujii, Tokyo (JP)

(73) Assignee: THINKON NEW TECHNOLOGY JAPAN CORPORATION, Tokyo (JP)

( * ) Notice: Subject to any disclaimer, the term of this patent is extended or adjusted under 35 U.S.C. 154(b) by 218 days.

This patent is subject to a terminal disclaimer.

(21) Appl. No.: 16/322,951

(22) PCT Filed: Jul. 28, 2017

(86) PCT No.: PCT/JP2017/027559
§ 371 (c)(1),
(2) Date: Feb. 3, 2019

(87) PCT Pub. No.: WO2018/025780
PCT Pub. Date: Feb. 8, 2018

(65) Prior Publication Data
US 2019/0164728 A1    May 30, 2019

(30) Foreign Application Priority Data

Aug. 4, 2016  (JP) .............................. JP2016-153986

(51) Int. Cl.
*H01J 37/32*   (2006.01)
*H05H 1/46*    (2006.01)
(Continued)

(52) U.S. Cl.
CPC .... *H01J 37/32642* (2013.01); *H01L 21/3065* (2013.01); *H01L 21/67069* (2013.01); *H05H 1/46* (2013.01); *H01J 2237/334* (2013.01)

(58) Field of Classification Search
None
See application file for complete search history.

(56) References Cited

U.S. PATENT DOCUMENTS

2003/0066484 A1 *  4/2003  Morikage ......... H01J 37/32009
                                                118/723 E
2004/0213955 A1   10/2004  Boyle et al.
(Continued)

FOREIGN PATENT DOCUMENTS

JP    2001-101968    4/2001
JP    2002-190466    7/2002
(Continued)

OTHER PUBLICATIONS

English Machine Translation of Sakuragi (JP2008300425A) retrieved from ESPACNET Oct. 28, 2020 (Year: 2020).*
(Continued)

*Primary Examiner* — Ram N Kackar
*Assistant Examiner* — Laureen Chan
(74) *Attorney, Agent, or Firm* — Wentsler LLC (57)  ABSTRACT

A ring for an electrode includes three or more silicon members having an arc shape and a joining part joining the silicon members. The joining part contains boron oxide.
A clean copy of the amended abstract is provided in Exhibit A of this preliminary amendment.

12 Claims, 4 Drawing Sheets

(51) Int. Cl.
  *H01L 21/3065* (2006.01)
  *H01L 21/67* (2006.01)

(56) References Cited

U.S. PATENT DOCUMENTS

| | | | | |
|---|---|---|---|---|
| 2004/0266158 | A1* | 12/2004 | Boyle | H01L 21/67306 |
| | | | | 438/612 |
| 2010/0116436 | A1 | 5/2010 | Kitajima et al. | |
| 2011/0023543 | A1* | 2/2011 | Umetsu | C03B 29/02 |
| | | | | 65/28 |
| 2012/0175063 | A1 | 7/2012 | Yamawaku et al. | |
| 2015/0243488 | A1 | 8/2015 | Kubota et al. | |
| 2017/0056994 | A1* | 3/2017 | Joslin | B23K 35/24 |

FOREIGN PATENT DOCUMENTS

| | | | |
|---|---|---|---|
| JP | 2008-251639 | | 10/2008 |
| JP | 2008300425 A | * | 12/2008 |
| JP | 2010-114313 | | 5/2010 |
| JP | 2011-003730 | | 1/2011 |
| JP | 2011003730 A | * | 1/2011 |
| JP | 2012-040677 | | 3/2012 |
| JP | 2012-146743 | | 8/2012 |
| JP | 2014-094855 | | 5/2014 |
| JP | 2014094855 A | * | 5/2014 |
| JP | 2015-065024 | | 4/2015 |
| JP | 2015-159202 | | 9/2015 |
| KR | 930010973 B1 | * | 11/1993 |

OTHER PUBLICATIONS

English Machine Translation of Lee et al. KR93-0010973B1 retrieved from google patents Apr. 26, 2021 (Year: 2021).*
Smith, B.D. and Hughes, M.P. (2001). Boric Acid. In Encyclopedia of Reagents for Organic Synthesis, (Ed.). (Year: 2001).*
Legtenberg et al. J. Micromech. Low-temperature glass bonding for sensor applications using boron oxide thin films. Microeng. 1 (1991) 157-160. (Year: 1991).*
Lewis et al. (2007). Boric Acid. In Hawley's Condensed Chemical Dictionary, https://doi.org/10.1002/9780470114735.hawley02221 (Year: 2007).*
International Search Report dated Sep. 26, 2017 in International Application No. PCT/JP2017/027559.
Extended European Search Report (EESR) dated Feb. 13, 2020 in European Patent Application No. 17836885.8, corresponding to PCT/JP2017/027559.

* cited by examiner

RING FOR ELECTRODE

TECHNICAL FIELD

The present invention relates to a ring for an electrode.

BACKGROUND ART

A dry etching apparatus using plasma is used as an etching apparatus in manufacture of a semiconductor integrated device such as an LSI. In the dry etching apparatus, while a wafer to be etched is placed on a cathode of a planar electrode and etching gas is introduced into the apparatus, a high-frequency voltage is applied between the cathode and a counter electrode (anode) by a high-frequency oscillator to generate plasma of the etching gas between the electrodes. Positive ions as activated gas in the plasma enter a surface of the wafer to etch the wafer.

A metal component causes metal contamination when it is used inside the dry etching apparatus, and therefore, a silicon component is used. Representative examples of the silicon component include a focus ring that has a doughnut shape surrounding the wafer to be etched (Patent Literature 1). It is necessary for the focus ring to have a diameter larger than that of the wafer to be etched. A silicon component for 300 mm wafer, which is mainly in current use, is expensive because the silicon component is fabricated from a silicon crystal ingot having a diameter of 320 mm or more.

CITATION LIST

Patent Literature

Patent Literature 1: Japanese Patent Laid-Open No. 2002-190466

SUMMARY OF INVENTION

Technical Problem

If the silicon component can be manufactured by joining a plurality of silicon members, not from a one-piece component, silicon crystal ingots that have a smaller diameter can be used for fabrication of the silicon component. Therefore, various advantages such as manufacturing cost reduction are expected.

An object of the present invention is to provide a ring for an electrode in which a plurality of silicon members are joined together.

Solution to Problem

A ring for an electrode according to the present invention includes three or more silicon members having an arc shape and a joining part joining the silicon members. The joining part contains boron oxide.

A ring for an electrode according to the present invention includes three or more silicon members having an arc shape, a joining part joining the silicon members, and silicon plugging the joining part. The joining part contains any of Al, Ga, Ge, and Sn, and contains a eutectic alloy with silicon.

A ring for an electrode according to the present invention includes three or more silicon members having an arc shape, a joining part joining the silicon members, and silicon plugging the joining part. The joining part contains boron oxide.

A ring for an electrode according to the present invention includes a first ring body including three or more first silicon members having an arc shape, a second ring body that is coaxially superposed on the first ring body and includes three or more second silicon members having an arc shape, a joining part provided between the first ring body and the second ring body, and silicon filling a gap between abutting surfaces of the first silicon members and/or a gap between abutting surfaces of the second silicon members.

Advantageous Effects of Invention

According to the present invention, it is possible to manufacture the ring for the electrode by combining three or more silicon members each cut out from a wafer that has a size smaller than an outer diameter of a focus ring. Accordingly, for the ring for the electrode, it is unnecessary to use the wafer that has a size larger than the outer diameter of the focus ring, and accordingly the cost can be reduced.

DESCRIPTION OF EMBODIMENT

An embodiment of the present invention is described in detail below with reference to drawings.

Figure 1:
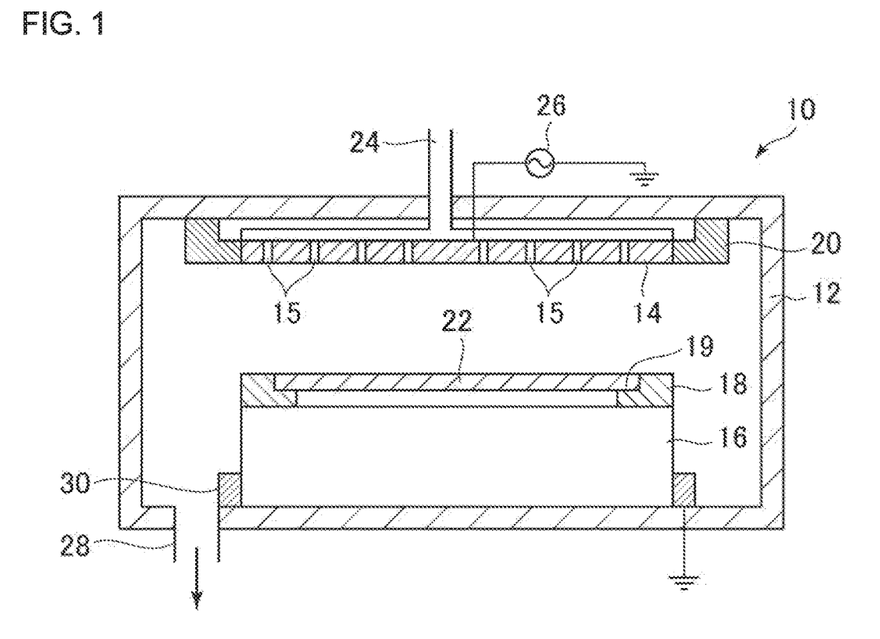
FIG. 1 is a cross-sectional view schematically illustrating a configuration of a dry etching apparatus that includes a focus ring fabricated from a ring for an electrode according to the present embodiment.

A dry etching apparatus 10 illustrated in FIG. 1 includes a vacuum chamber 12, an upper electrode plate 14, a base 16, and a focus ring 18. The upper electrode plate 14 is a disc-like member, and is fixed to an upper part inside the vacuum chamber 12 by a support ring 20. The support ring 20 is made of silicon as an insulating member. The upper electrode plate 14 includes a plurality of through holes 15 each penetrating through the upper electrode plate 14 in a thickness direction. The upper electrode plate 14 is electrically connected with a high-frequency power supply 26. The upper electrode plate 14 is connected with a gas supply pipe 24. Etching gas supplied through the gas supply pipe 24 may flow into the vacuum chamber 12 from the through holes 15 of the upper electrode plate 14, and may be exhausted to outside from an exhaust port 28.

The base 16 is disposed at a lower part inside the vacuum chamber 12 and is surrounded by a ground ring 30. The ground ring 30 is made of silicon as an insulating member, and is grounded. The focus ring 18 is provided on the base 16. The focus ring 18 is made of silicon as an insulating member, and a concave part 19 supporting a peripheral edge of a wafer 22 is provided over an entire inner circumference.

The dry etching apparatus 10 is supplied with the etching gas through the upper electrode plate 14. When the high-frequency voltage is applied from the high-frequency power supply 26, plasma is generated between the upper electrode plate 14 and the wafer 22. The surface of the wafer 22 is etched by this plasma.

The ring for the electrode according to the present embodiment is applicable to the focus ring 18, the support ring 20, and the ground ring 30 described above. The ring for the electrode is not limited to the focus ring 18, the support ring 20, and the ground ring 30 described above. The ring for the electrode is applicable to a silicon member that is placed inside the vacuum chamber 12 of the dry etching apparatus 10 and is supplied with the voltage or is grounded.

The ring for the electrode according to the present embodiment that serves as the member of the focus ring 18 is described with reference to FIG. 2. A ring 32 for an electrode includes a first ring body 34 that includes at least three or more silicon members 38 having an arc shape and a joining part (not illustrated in the figure) provided among the silicon members 38. The silicon members 38 each may contain monocrystalline silicon or polycrystalline silicon, and a manufacturing method, purity, crystal orientation, etc. thereof are not limited.

In the case of the figure, the ring 32 for the electrode includes the first ring body 34 including three silicon members 38, and a second ring body 36 that includes three silicon members 38 same as those of the first ring body 34. The first ring body 34 and the second ring body 36 are coaxially superposed through joining surfaces 39 while abutting surfaces 37 of the silicon members 38 of the first ring body 34 are out of position in a circumferential direction from abutting surfaces 37 of the silicon members 38 of the second ring body 36.

Figure 3:
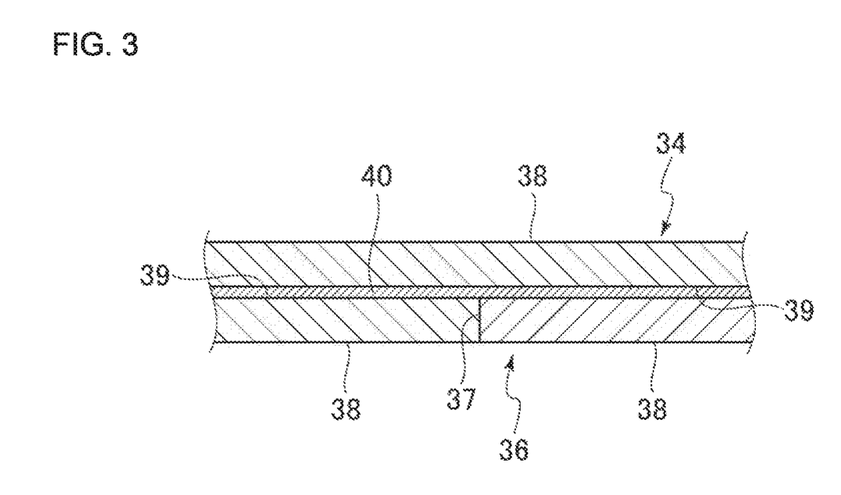
FIG. 3 is a partial cross-sectional view illustrating a joining part.

As illustrated in FIG. 3, a joining part 40 is provided at least a part among the silicon members 38. In the case of the figure, the joining part 40 is provided between the joining surface 39 of the first ring body 34 and the joining surface 39 of the second ring body 36. The joining part 40 is made of a eutectic alloy of silicon and silicon containing a metal forming a eutectic alloy with silicon. The metal forming a eutectic alloy with silicon is any one of Al, Ga, Ge, and Sn (hereinafter, also referred to as "alloying metal"). The metals Al, Ga, Ge, and Sn are preferable because each of the metals has a low diffusion coefficient in silicon crystal and is little diffused in a silicon member, hardly forms a deep level that becomes an electric problem, and has no influence on environment. The most preferable metal is Al because of low price. The purity of the alloying metal is not particularly limited as long as the alloying metal can form a eutectic with silicon, and the purity of the alloying metal is preferably 98% or more.

Figure 4:
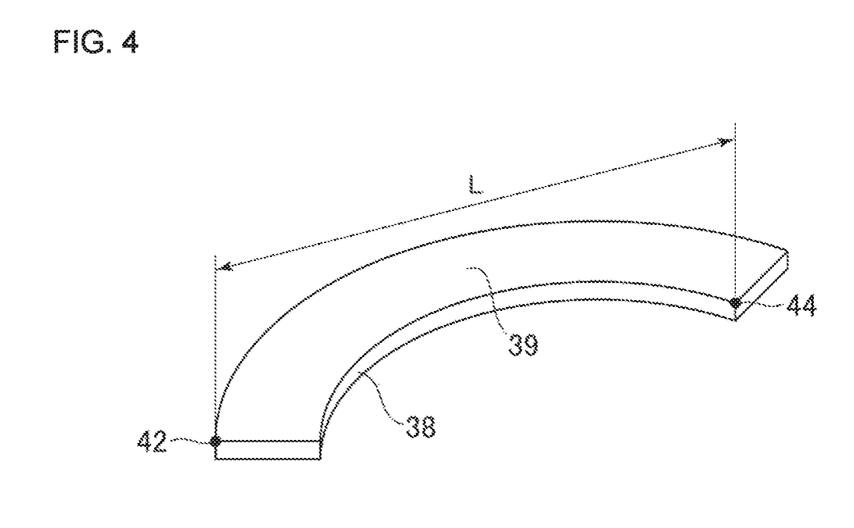
FIG. 4 is a perspective view illustrating a silicon member.

Each of the silicon members 38 preferably has a thickness of 1 mm or more and 50 mm or less and a width of 10 mm or more and 100 mm or less, and a length L of a line segment connecting two corner vertices 42 and 44 that are not adjacent to each other on the joining surface 39 is preferably 160 mm or more and 220 mm or less. Each of the silicon members 38 having the above-described size can be cut out and fabricated from a silicon crystal ingot for 6-inch (150 mm) wafer that is currently widely distributed. The cost merit is high.

Next, a method of manufacturing the ring 32 for the electrode is described. First, surface treatment is performed on the silicon members 38. More specifically, surfaces of the respective silicon members 38 are treated by grinding, polishing, or the like, to preferably form mirror surfaces. The surfaces of the respective silicon members 38 may be etched by mixed solution of hydrofluoric acid and nitric acid. As the mixed solution, chemical polishing solution (hydrofluoric acid (49%): nitric acid (70%): acetic acid (100%)=3:5:3) standardized as JIS H 0609 may be used.

Subsequently, the three silicon members 38 are arranged in the ring shape such that a gap is not generated between the abutting surfaces 37 of the silicon members 38. Next, an alloying metal foil is disposed on the surfaces of the silicon members 38. A thickness of the alloying metal foil is preferably small in terms of reduction in energy for melting. The thickness of the alloying metal foil is preferably 0.1 μm to 100 μm, and more preferably 0.5 μm to 20 μm to exert joining strength. If the thickness of the alloying metal foil is lower than the above-described lower limit value, the alloying metal foil is easily damaged when placed on the joining surface. If the thickness of the alloying metal foil is larger than the above-described upper limit value, a part where joining with silicon is insufficient is easily generated. Subsequently, the other three silicon members 38 are placed on the alloying metal foil. The other silicon members 38 are disposed so as to be out of position, by half of a length in a longitudinal direction, from the silicon members 38 that have been already disposed. The other silicon members 38 are stacked on the silicon members 38 that have been already disposed, through the alloying metal foil in the above-described manner.

Next, heating is performed from the other silicon members 38 side, to generate a melt containing silicon and the alloying metal. The heating method is not particularly limited, and the heating can be performed through resistance heating, optical heating, etc. The optical heating is preferable because positions to be heated can be easily shifted, and a heating amount can be easily changed based on the supplied power. For example, various kinds of lamps and lasers are used.

Figure 5:
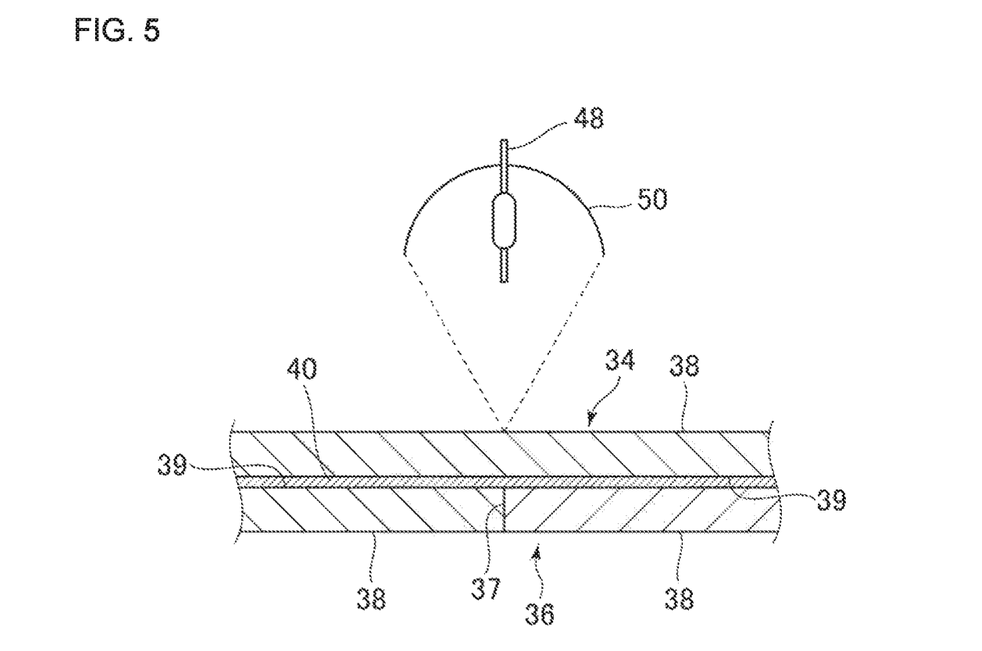
FIG. 5 is a cross-sectional view schematically illustrating an apparatus manufacturing the ring for the electrode.

In the present embodiment, an apparatus illustrated in FIG. 5 can be used. The apparatus illustrated in the figure includes at least one lamp 48 and at least one light condensing portion 50 that condenses light emitted from the lamp 48. As the lamp 48, a xenon lamp or a halogen lamp that is commonly used in an infrared crystal growth apparatus is usable. An output of the lamp is preferably about 1 kW to about 30 kW.

The heating is performed from upper side of the other silicon members 38. The heating may be performed from obliquely upper side without being limited to upper side in a direction perpendicular to the other silicon members 38 as long as the heating is performed from the upper side. The alloying metal foil is first melted by the heating and a metal melt is generated. Next, the joining surfaces of the silicon members 38 in contact with the metal melt are attacked by the metal melt, and a melt containing silicon is generated. It is considered that when the heating is stopped and temperature is lowered, the melt is solidified while forming an alloy phase containing a eutectic, and joining is completed. For example, in a case where an Al foil is used, the silicon members 38 can be sufficiently joined by heating up to about 800° C.

A light focused region normally has a diameter of about 10 mm to about 30 mm. The diameter of the light focused region is increased to about 30 mm to about 100 mm when a light emission position of the lamp is out of position from a focal point of an elliptical mirror. The light focused region thus expanded makes it possible to expand a heated range.

The light focused region is preferably moved to scan the metal foil and the entire surfaces of the silicon members 38, to effect heating.

Next, the melt containing silicon and the alloying metal is cooled and solidified to generate the joining part 40 containing a eutectic alloy. The silicon members 38 can be joined to one another to manufacture the ring 32 for the electrode in the above-described manner.

When the alloying metal is Al and is cooled up to about 577° C., the joining part 40 containing Al-silicon eutectic (12.2 atomic % Al) is generated. A cooling speed depends on the alloying metal to be used. In the case where Al is used, the cooling speed is preferably controlled to 10 to 100° C./min. If the cooling speed is lower than the above-described lower limit value, a cooling time is lengthened and efficiency is low. If the cooling speed is higher than the above-described upper limit value, distortion tends to remain in the joining part 40. The cooling speed can be controlled by gradually reducing the output of heating means after melting of the alloying metal foil is completed, and stopping the heating when the temperature of the joining part 40 is estimated to be lower than melting temperature of the eutectic. Such control of the heating temperature can be performed based on a result of a measurement of relationship between power of the heating means and the temperature. The measurement is previously performed, for example, while a thermocouple having a shape similar to the silicon members 38 to be actually pasted together is disposed between the silicon members 38.

Generation of the melt by the heating and generation of the joining part 40 containing the eutectic alloy by the cooling described above are preferably performed inside a chamber of argon atmosphere of 10 torr to 200 torr (about 1333 Pa to about 26664 Pa) in order to prevent oxidation of the alloying metal and silicon. It is also possible to prevent oxidation by decompression without using argon gas; however, this is not preferable because decompression causes evaporation of silicon and the inside of the chamber may be contaminated. Further, oxidation can be prevented by nitrogen gas; however, this is not preferable because silicon is nitrided at temperature of 1200° C. or more.

The gap between the abutting surfaces 37 of the silicon members is preferably plugged by heating and melting silicon near the abutting surfaces 37. The gap between the abutting surfaces 37 is plugged by melting silicon, which makes it possible to prevent the eutectic alloy from being exposed.

The ring 32 for the electrode obtained in the above-described manner may serve as the focus ring 18 by being provided with the concave part 19 over the entire inner circumference by machining.

The ring 32 for the electrode is manufacturable by combining three or more silicon members 38 that are each cut out from a silicon crystal ingot for wafer having a size smaller than the outer diameter of the focus ring 18. Accordingly, it is unnecessary for the ring 32 for the electrode to use the silicon crystal ingot for wafer that has a size larger than the outer diameter of the focus ring 18, which allows for reduction of the cost.

Modification

The present invention is not limited to the above-described embodiment, and can be appropriately modified within the scope of the present invention.

Figure 6:
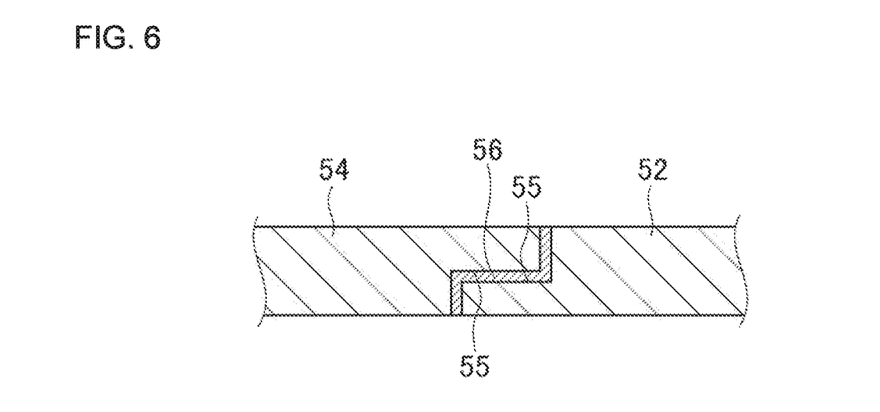
FIG. 6 is a partial cross-sectional view illustrating a joining part according to a modification.

In the above-described embodiment, the case where the ring 32 for the electrode includes the first ring body 34 and the second ring body 36 that are coaxially superposed has been described; however, the present invention is not limited thereto. For example, the ring for the electrode may include only the first ring body. In this case, as illustrated in FIG. 6, abutting surfaces 55 of respective silicon members 52 and 54 each preferably include two consecutive right-angled bends. When the abutting surfaces 55 each include the two bends, an area of a joining part 56 is increased. Therefore, it is possible to improve joining strength as compared with a case where no bend is provided.

Figure 2:
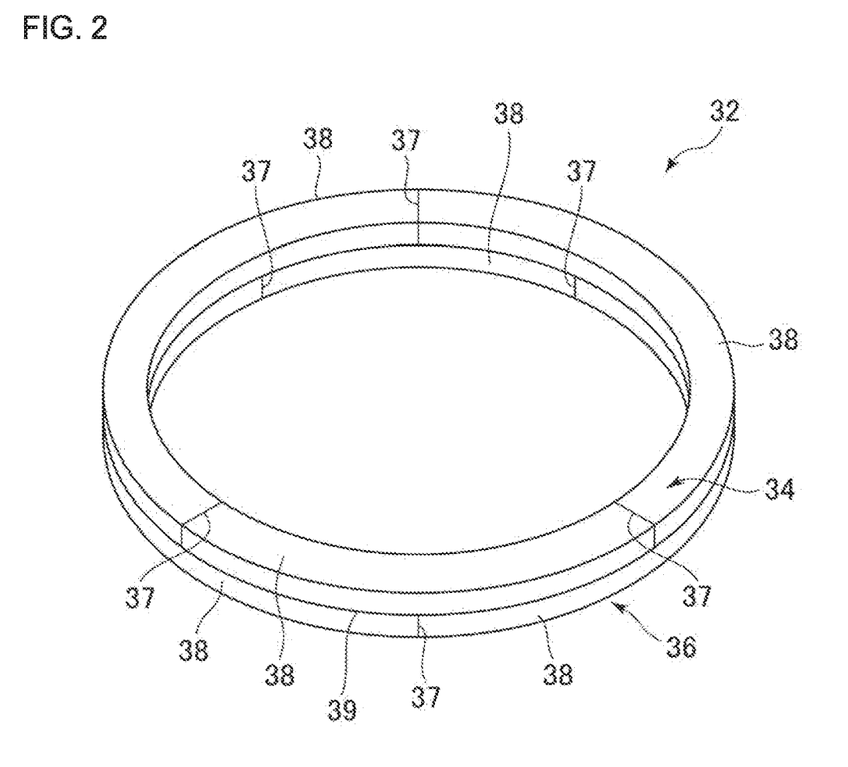
FIG. 2 is a perspective view illustrating the ring for the electrode according to the present embodiment.
Figure 7:
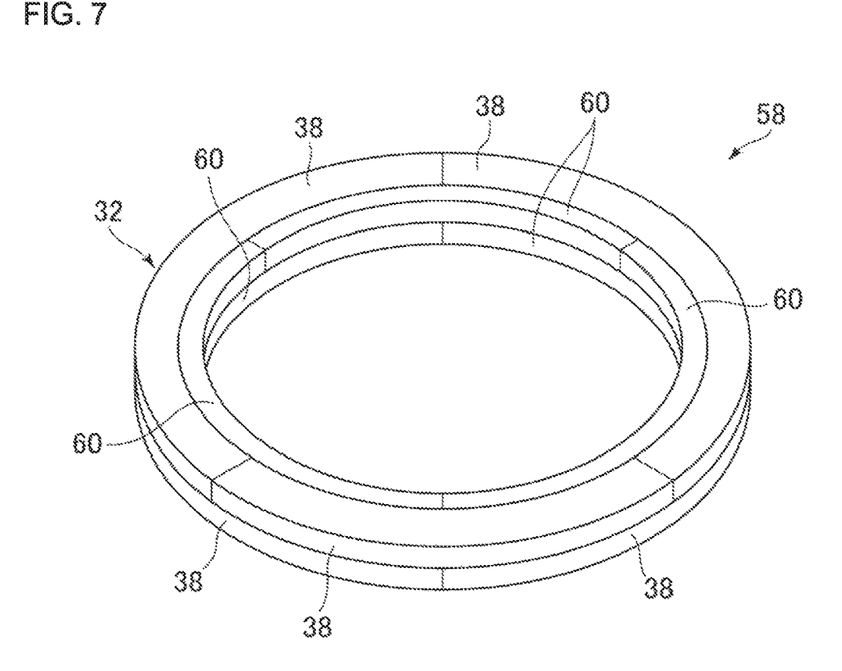
FIG. 7 is a perspective view illustrating a ring for an electrode according to a modification.

As illustrated in FIG. 7, a ring 58 for an electrode may further include three or more silicon inner peripheral members 60 having an arc shape on an inner peripheral surface of the ring 32 for the electrode as illustrated in FIG. 2. In this figure, the ring 58 for the electrode includes six silicon inner peripheral members 60 in total, which may easily form the focus ring 18 having a smaller inner diameter. The six silicon inner peripheral members 60 are arranged in such a manner that two sets of silicon inner peripheral members 60 are superposed in an axis direction, and each of the sets includes three silicon inner peripheral members 60 arranged in a circumferential direction.

Figure 8:
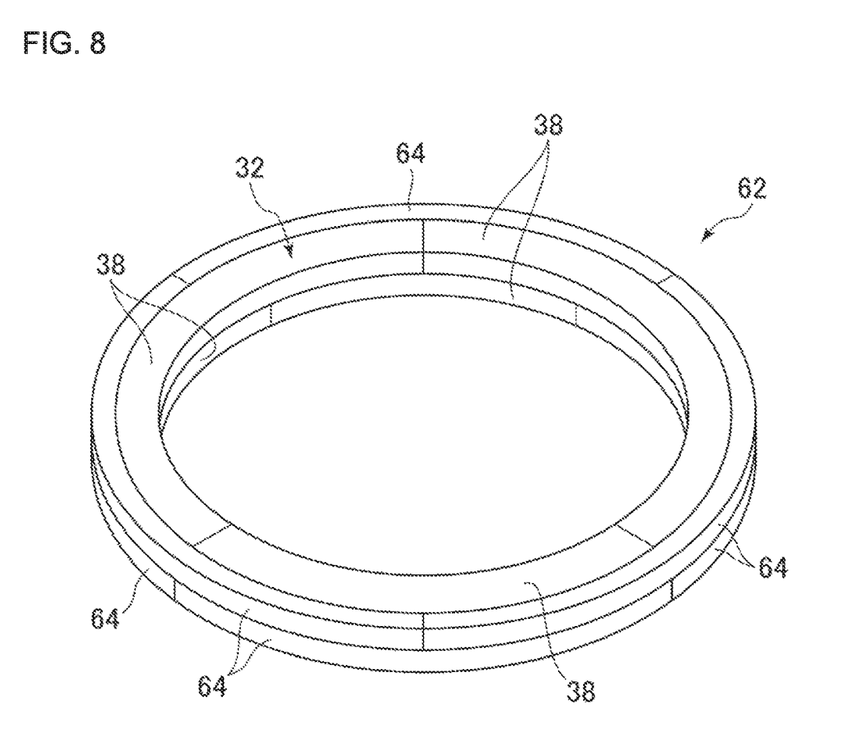
FIG. 8 is a perspective view illustrating a ring for an electrode according to another modification.

As illustrated in FIG. 8, a ring 62 for an electrode may further include three or more silicon outer peripheral members 64 having an arc shape on an outer peripheral surface of the ring 32 for the electrode illustrated in FIG. 2. In this figure, the ring 62 for the electrode includes six silicon outer peripheral members 64 in total, which may easily form the focus ring 18 having a larger outer diameter. The six silicon outer peripheral members 64 are arranged in such a manner that two sets of silicon outer peripheral members 64 are superposed in the axis direction and each of the sets includes three silicon outer peripheral members 64 arranged in the circumferential direction.

In the above-described embodiment, the case where the silicon members 38 are joined to each other with use of the alloying metal foil has been described; however, the present invention is not limited thereto. It is considered that the silicon members 38 can be joined to each other with use of powder or particles of the alloying metal. In a case of using Ga, which is low melting-point metal, films directly applied on the respective surfaces of the silicon members 38 may be used.

The case where the silicon members 38 are arranged so as not to form the gap between the abutting surfaces 37 and silicon is melted to plug the gap between the abutting surfaces 37 after the joining part is formed on the joining surfaces has been described; however, the present invention is not limited thereto. For example, the alloying metal foil may be disposed on the abutting surfaces to also form a joining part between the abutting surfaces. The alloying metal foil disposed in a perpendicular direction along the abutting surfaces 37 is melted by being heated from above obliquely by about 30 degrees from the perpendicular direction, thereby serving as the joining part.

In the above-described embodiment, the case where the joining part 40 contains the alloying metal has been described; however, the present invention is not limited thereto, and the joining part 40 may contain boron oxide. A method of manufacturing the ring for the electrode in the case where the joining part 40 contains boron oxide is described below.

First, three surface-treated silicon members are arranged in a ring shape in a manner similar to the above-described embodiment. Subsequently, the silicon members are heated to first temperature (180° C. to 280° C.), and a starting material made of particulate boric acid ($B(OH)_3$) is supplied to at least a part of the joining surfaces of the silicon members. The silicon members can be heated by heating means using a common electric resistance heater. Since the temperature of the joining surfaces is 180° C. to 280° C., dehydration reaction of boric acid occurs on the joining surfaces. Water is desorbed from boric acid in about 10 seconds to about 60 seconds, and metaboric acid ($HBO_2$) is accordingly generated. Metaboric acid is dissolved into the desorbed water to generate a liquid substance having excellent fluidity.

In a case where the temperature of the silicon members is excessively low, water cannot be desorbed from boric acid, and metaboric acid cannot be obtained. In contrast, in a case where the temperature of the silicon members is excessively high, water is quickly desorbed from boric acid. As a result, boric acid supplied to the joining surfaces of the silicon members may be splattered or boric acid may be quickly solidified. When the first temperature is 180° C. to 280° C., it is possible to more surely obtain metaboric acid. The first temperature is preferably 200° C. to 240° C.

As the starting material made of particulate boric acid, granular boric acid having a diameter of 0.1 mm to 2 mm sold on the open market can be used as it is. When the starting material made of boric acid having a diameter of 0.1 mm to 2 mm is supplied to the surfaces of the silicon members heated to the first temperature, it is possible to form a layer containing metaboric acid described later. Boric acid is preferably supplied little by little to a part of the surfaces of the silicon members.

The liquid substance that has been generated through desorption of water from boric acid is spread by a spatula to form the layer containing metaboric acid. As described above, boric acid as the starting material is supplied little by little to the joining surfaces of the silicon members, and the generated liquid substance is spread every time. As a result, it is possible to form the uniform layer containing metaboric acid on the joining surfaces. A cut wafer is used as the spatula, which makes it possible to avoid mixture of impurity into the layer containing metaboric acid.

A thickness of the layer containing metaboric acid is preferably 1 mm or less, and more preferably 0.1 mm to 0.5 mm. Generation of bubbles caused by dehydration reaction can be suppressed when heating is performed in a subsequent step as the thickness of the layer containing metaboric acid is smaller. The thickness of the layer containing metaboric acid can be adjusted by controlling an amount of boric acid to be supplied as the starting material.

The silicon members that have been provided with the layer containing metaboric acid on the joining surfaces are heated to increase its temperature to second temperature (500° C. to 700° C.). As a result, water is further desorbed from metaboric acid, and a melt containing boron oxide ($B_2O_3$) is accordingly generated. In a case where the second temperature is excessively high, the silicon members may be cracked due to difference of thermal expansion coefficients between boron oxide and silicon when cooling is performed in a subsequent step. In the case where the second temperature is 500° C. to 700° C., it is possible to more surely obtain the melt containing boron oxide. The second temperature is preferably 550° C. to 600° C.

The other surface-treated silicon members are bonded by pressing on the melt containing boron oxide generated on a joining region of the silicon members. Pressure in press-bonding is not particularly limited, and is appropriately settable. In a case where a width of each of the silicon members is about 30 mm, the silicon members and the other silicon members can be joined with a heat insulating material in between by pressing with hands.

When the melt of boron oxide is solidified, the silicon members and the other silicon members are joined to each other by the boron oxide layer. The melt is solidified, for example, when left at room temperature. The joining part is generated in the above-described manner to manufacture the ring for the electrode.

The layer containing metaboric acid may be formed not over the entire region of the joining surfaces of the silicon members but in a frame shape along an outer edge of the joining surfaces. The width of the frame-shaped layer containing metaboric acid can be 5 mm to 10 mm. The alloying metal foil is disposed in a region inside the frame-shaped layer containing metaboric acid. Before the alloying metal foil is disposed in the inside region, the frame-shaped layer containing metaboric acid may be cooled and the surface thereof may be polished to reduce the thickness. The frame-shaped layer containing metaboric acid is formed on the joining surfaces of the silicon members and the alloying metal foil is disposed. Thereafter, the other silicon members are disposed, and the silicon members and the other silicon members are heated to eutectic temperature or more and 700° C. or less. The alloying metal forms a eutectic with silicon by the heating, which makes it possible to more firmly join the silicon members to each other. The eutectic alloy formed at this time is surrounded by the frame-shaped boron oxide layer. Therefore, the metal is hardly dispersed to cause contamination.

The ring for the electrode may be manufactured in such a manner that the joining surfaces of the silicon members are selectively heated to melt silicon near the joining surfaces, thereby fusing the silicon members.

REFERENCE SIGNS LIST

32 Ring for electrode
34 First ring body
36 Second ring body
37 Abutting surface
38 Silicon member
40 Joining part
52, 54 Silicon member
55 Abutting surface
56 Joining part
58 Ring for electrode
60 Silicon inner peripheral member
62 Ring for electrode
64 Silicon outer peripheral member

The invention claimed is:

1. A ring for an electrode, comprising:
   a first ring body comprising three or more first silicon members having an arc shape arranged in a circumferential direction with first abutting surfaces of each of the three or more first silicon members facing a corresponding first abutting surface of an adjacent first silicon member;
   an outer ring body comprising three or more silicon outer peripheral members having an arc shape on an outer peripheral surface of the first ring body, the three or more silicon outer peripheral members arranged in a circumferential direction with outer abutting surfaces of each of the three or more silicon outer peripheral members facing a corresponding outer abutting surface of an adjacent silicon outer peripheral member; and
   a joining part provided between the first ring body and the outer ring body, wherein the joining part is a layer of $B_2O_3$ and metaboric acid, and the first abutting surfaces are out of alignment in the circumferential direction from the outer abutting surfaces;

wherein the joining part further fills a gap between adjacent abutting surfaces of the first silicon members and another gap between adjacent abutting surfaces of the silicon outer peripheral members.

2. The ring for the electrode according to claim 1, wherein the joining part further contains any of Al, Ga, Ge, and Sn, forming a eutectic alloy with silicon.

3. The ring for the electrode according to claim 1, wherein a length of a line segment connecting two corner vertices disposed on a joining surface of each of the first silicon members, the vertices being on opposite ends of the silicon member, and one vertex is located on a radially inner arcuate edge of the silicon member and the other vertex is located on a radially outer arcuate edge of the silicon member, is 160 mm or more and 220 mm or less.

4. The ring for the electrode according to claim 1, wherein the first silicon members comprise monocrystalline silicon.

5. A ring for an electrode, comprising:

a first ring body comprising three or more first silicon members having an arc shape arranged in a circumferential direction with first abutting surfaces of each of the three or more first silicon members facing a corresponding first abutting surface of an adjacent first silicon member;

an inner ring body comprising three or more silicon inner peripheral members having an arc shape on an inner peripheral surface of the first ring body, the three or more silicon inner peripheral members arranged in a circumferential direction with inner abutting surfaces of each of the three or more silicon inner peripheral members facing a corresponding inner abutting surface of an adjacent silicon inner peripheral member; and a joining part provided between the first ring body and the inner ring body, wherein the joining part is a layer of $B_2O_3$ and metaboric acid, and the first abutting surfaces are out of alignment in the circumferential direction from the inner abutting surfaces;

wherein the joining part further fills a gap between adjacent abutting surfaces of the first silicon members and another gap between adjacent abutting surfaces of the silicon inner peripheral members.

6. The ring for the electrode according to claim 5, wherein the first silicon members comprise monocrystalline silicon.

7. The ring for the electrode according to claim 5, wherein the joining part further contains any of Al, Ga, Ge, and Sn, forming a eutectic alloy with silicon.

8. The ring for the electrode according to claim 5, wherein a length of a line segment connecting two corner vertices disposed on a joining surface of each of the first silicon members, the vertices being on opposite ends of the silicon member, and one vertex is located on a radially inner arcuate edge of the silicon member and the other vertex is located on a radially outer arcuate edge of the silicon member, is 160 mm or more and 220 mm or less.

9. A ring for an electrode, comprising:

a first ring body comprising three or more first silicon members having an arc shape arranged in a circumferential direction with first abutting surfaces of each of the three or more first silicon members facing a corresponding first abutting surface of an adjacent first silicon member;

a second ring body comprising three or more second silicon members having an arc shape arranged in the circumferential direction with second abutting surfaces of each of the three or more second silicon members facing a corresponding second abutting surface of an adjacent second silicon member; and a joining part provided between the first ring body and the second ring body, wherein the joining part is a layer of $B_2O_3$ and metaboric acid, the first ring and the second ring are coaxially superimposed, and the first abutting surfaces are out of alignment in the circumferential direction from the second abutting surfaces;

wherein the joining part further fills a gap between adjacent abutting surfaces of the first silicon members and another gap between adjacent abutting surfaces of the second silicon members.

10. The ring for the electrode according to claim 9, wherein the first silicon members comprise monocrystalline silicon.

11. The ring for the electrode according to claim 9, wherein the joining part further contains any of Al, Ga, Ge, and Sn, forming a eutectic alloy with silicon.

12. The ring for the electrode according to claim 9, wherein a length of a line segment connecting two corner vertices disposed on a joining surface of each of the first silicon members, the vertices being on opposite ends of the silicon member, and one vertex is located on a radially inner arcuate edge of the silicon member and the other vertex is located on a radially outer arcuate edge of the silicon member, is 160 mm or more and 220 mm or less.

* * * * *